United States Patent
Kim et al.

(10) Patent No.: US 9,674,968 B2
(45) Date of Patent: Jun. 6, 2017

(54) RIGID FLEXIBLE PRINTED CIRCUIT BOARD AND METHOD OF MANUFACTURING THE SAME

(71) Applicant: SAMSUNG ELECTRO-MECHANICS CO., LTD., Suwon-Si, Gyeonggi-Do (KR)

(72) Inventors: Ha Il Kim, Suwon-Si (KR); Dong Gi An, Suwon-Si (KR); Su Hyun Park, Suwon-Si (KR); Young Man Kim, Suwon-Si (KR); Jong Hyung Kim, Suwon-Si (KR); Kyung Chul Yu, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 119 days.

(21) Appl. No.: 14/695,712

(22) Filed: Apr. 24, 2015

(65) Prior Publication Data
US 2015/0319844 A1    Nov. 5, 2015

(30) Foreign Application Priority Data
Apr. 30, 2014    (KR) .................. 10-2014-0052793

(51) Int. Cl.
*H05K 1/02*    (2006.01)
*H05K 1/18*    (2006.01)
*H05K 3/46*    (2006.01)
*H05K 3/10*    (2006.01)
*H05K 3/30*    (2006.01)

(52) U.S. Cl.
CPC .......... *H05K 3/4691* (2013.01); *H05K 1/028* (2013.01); *H05K 1/0278* (2013.01); *H05K 1/0298* (2013.01); *H05K 1/181* (2013.01); *H05K 3/10* (2013.01); *H05K 3/30* (2013.01); *H05K 2201/05* (2013.01); *H05K 2201/09018* (2013.01); *H05K 2201/09127* (2013.01); *Y10T 29/49126* (2015.01); *Y10T 29/49131* (2015.01); *Y10T 29/49156* (2015.01)

(58) Field of Classification Search
CPC .... H05K 3/4691; H05K 1/0278; H05K 1/028; H05K 1/0298; H05K 1/181; H05K 3/10; H05K 3/30
See application file for complete search history.

(56) References Cited

U.S. PATENT DOCUMENTS

| | | | | |
|---|---|---|---|---|
| 7,775,971 | B2 * | 8/2010 | Fujimori | A61B 1/04 600/110 |
| 8,035,983 | B2 * | 10/2011 | Takahashi | H05K 3/4691 174/255 |
| 8,178,789 | B2 * | 5/2012 | Takahashi | H05K 3/4691 174/261 |

(Continued)

*Primary Examiner* — Nathan Milakovich
(74) *Attorney, Agent, or Firm* — NSIP Law

(57) ABSTRACT

There are provided a rigid flexible printed circuit board and a method of manufacturing the same. The rigid flexible printed circuit board according to an exemplary embodiment of the present disclosure includes: a flexible board including a flexible region, a first rigid region formed at one side of the flexible region, and a second rigid region formed at the other side of the flexible region; a first rigid board formed on the flexible board and formed in the first rigid region and the second rigid region; and a second rigid board formed below the flexible board and formed in the first rigid region.

17 Claims, 5 Drawing Sheets

(56) References Cited

U.S. PATENT DOCUMENTS

| | | | | |
|---|---|---|---|---|
| 8,198,543 B2* | 6/2012 | Kang | H05K 3/4641 | 174/250 |
| 8,479,389 B2* | 7/2013 | Takahashi | H05K 3/4691 | 156/150 |
| 2001/0010303 A1* | 8/2001 | Caron | H05K 3/4691 | 216/18 |
| 2005/0176310 A1* | 8/2005 | Kataoka | H01R 4/02 | 439/876 |
| 2005/0243528 A1* | 11/2005 | Murayama | H05K 1/148 | 361/760 |
| 2006/0180344 A1* | 8/2006 | Ito | H01L 23/5385 | 174/262 |
| 2007/0277998 A1* | 12/2007 | Suzuki | H05K 1/0218 | 174/255 |
| 2008/0014768 A1 | 1/2008 | Lee et al. | | |
| 2008/0093118 A1* | 4/2008 | Takahashi | H05K 3/4691 | 174/264 |
| 2009/0084583 A1* | 4/2009 | Ueno | H05K 3/4691 | 174/254 |
| 2009/0126982 A1* | 5/2009 | Nakamura | H01L 21/6835 | 174/262 |
| 2009/0229876 A1* | 9/2009 | Takahashi | H05K 3/4691 | 174/378 |
| 2009/0283301 A1* | 11/2009 | Takahashi | H05K 3/4691 | 174/254 |
| 2010/0025087 A1* | 2/2010 | Takahashi | H05K 3/4691 | 174/254 |
| 2010/0051325 A1* | 3/2010 | Sato | H05K 3/4691 | 174/254 |
| 2010/0051326 A1* | 3/2010 | Sagisaka | H05K 1/141 | 174/254 |
| 2011/0067904 A1* | 3/2011 | Aoyama | H05K 3/4069 | 174/254 |
| 2011/0180306 A1* | 7/2011 | Naganuma | H05K 1/115 | 174/254 |
| 2011/0180307 A1* | 7/2011 | Naganuma | H05K 3/4691 | 174/254 |
| 2011/0194262 A1* | 8/2011 | Naganuma | H05K 3/4691 | 361/749 |
| 2011/0198111 A1* | 8/2011 | Naganuma | H05K 3/4691 | 174/254 |
| 2011/0199739 A1* | 8/2011 | Naganuma | H05K 3/4691 | 361/749 |
| 2011/0203837 A1* | 8/2011 | Naganuma | H05K 3/4691 | 174/254 |
| 2012/0222889 A1* | 9/2012 | Davis | C08G 18/345 | 174/254 |
| 2013/0122658 A1* | 5/2013 | Savic | H01L 23/24 | 438/126 |
| 2014/0034366 A1* | 2/2014 | Otsubo | H05K 3/4691 | 174/254 |
| 2014/0268780 A1* | 9/2014 | Wang | F21V 19/003 | 362/249.06 |
| 2014/0326487 A1* | 11/2014 | Ozeki | H05K 3/4655 | 174/254 |
| 2015/0060114 A1* | 3/2015 | Park | H05K 3/4691 | 174/254 |
| 2015/0181699 A1* | 6/2015 | Ikemoto | H05K 1/0281 | 174/254 |
| 2015/0189735 A1* | 7/2015 | Yu | H05K 3/4691 | 174/251 |
| 2016/0066429 A1* | 3/2016 | Taniguchi | H05K 1/0278 | 361/749 |
| 2016/0183363 A1* | 6/2016 | Lee | H05K 1/0278 | 174/254 |

* cited by examiner

RIGID FLEXIBLE PRINTED CIRCUIT BOARD AND METHOD OF MANUFACTURING THE SAME

CROSS-REFERENCE TO RELATED APPLICATION

This application claims the benefit of Korean Patent Application No. 10-2014-0052793, filed on Apr. 30, 2014, entitled "Rigid Flexible Printed Circuit Board and Method of Manufacturing the Same" which is hereby incorporated by reference in its entirety into this application.

BACKGROUND

The Embodiments of the present invention disclosure relate to a rigid flexible printed circuit board and a method of manufacturing the same.

Recently, importance of miniaturization, thinness, and an appearance design of electronic products has been increased. In order to implement the electronic product satisfying these requirements, the importance of a printed circuit board inserted into the electronic product has been emphasized. In accordance with the miniaturization and the thinness of the electronic product, a rigid flexible printed circuit board has been used as a board inserted into the electronic product. The rigid flexible printed circuit board has been efficiently used by dividing it into a rigid part on which a sensor and a component are mounted and a flexible part which is a bent part, in order to be efficiently disposed in a narrow space.

RELATED ART DOCUMENT

Patent Document (Patent Document 1) U.S. Patent Application Publication No. 2008-0014768

SUMMARY

An aspect of the embodiments of the present invention disclosure may provide a rigid flexible printed circuit board capable of minimizing a thickness increase, and a method of manufacturing the same.

According to an aspect of the embodiments of the present invention disclosure, a rigid flexible printed circuit board may include: a flexible board including a flexible region, a first rigid region formed at one side of the flexible region, and a second rigid region formed at the other side of the flexible region; a first rigid board formed on the flexible board and formed in the first rigid region and the second rigid region; and a second rigid board formed below the flexible board and formed in the first rigid region.

The rigid flexible printed circuit board may further include a first component mounted on the first rigid board in the second rigid region.

The flexible board in the flexible region may be bent so that an upper surface of the first component is positioned at the same height as or a height lower than an upper surface of the first rigid board formed in the first rigid region.

The rigid flexible printed circuit board may further include: a first component mounted on the first rigid board in the second rigid region; and a second component mounted on the first rigid board in the first rigid region. The flexible board may be bent so that an upper surface of the first component is positioned at the same height as or a height lower than an upper surface of the second component.

According to another aspect of the embodiments of the present invention disclosure, a method of manufacturing a rigid flexible printed circuit board may include: forming a flexible board including a flexible region, a first rigid region formed at one side of the flexible region, and a second rigid region formed at the other side of the flexible region; forming a first rigid board on the flexible board and forming a second rigid board below the flexible board; and removing the first rigid board in the flexible region and the second rigid boards in the second rigid region and the flexible region.

The method may further include, after the removing of the first rigid board in the flexible region and the second rigid boards in the second rigid region and the flexible region, mounting a first component on the first rigid board in the second rigid region. The method may further include bending the flexible board in the flexible region so that an upper surface of the first component is positioned at the same height as or a height lower than an upper surface of the first rigid board formed in the first rigid region.

The method may further include, after the removing of the first rigid board in the flexible region and the second rigid boards in the second rigid region and the flexible region, mounting a first component on the first rigid board in the second rigid region and mounting a second component on the first rigid board in the first rigid region. The method may further include bending the flexible board in the flexible region so that an upper surface of the first component is positioned at the same height as or a height lower than an upper surface of the second component.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
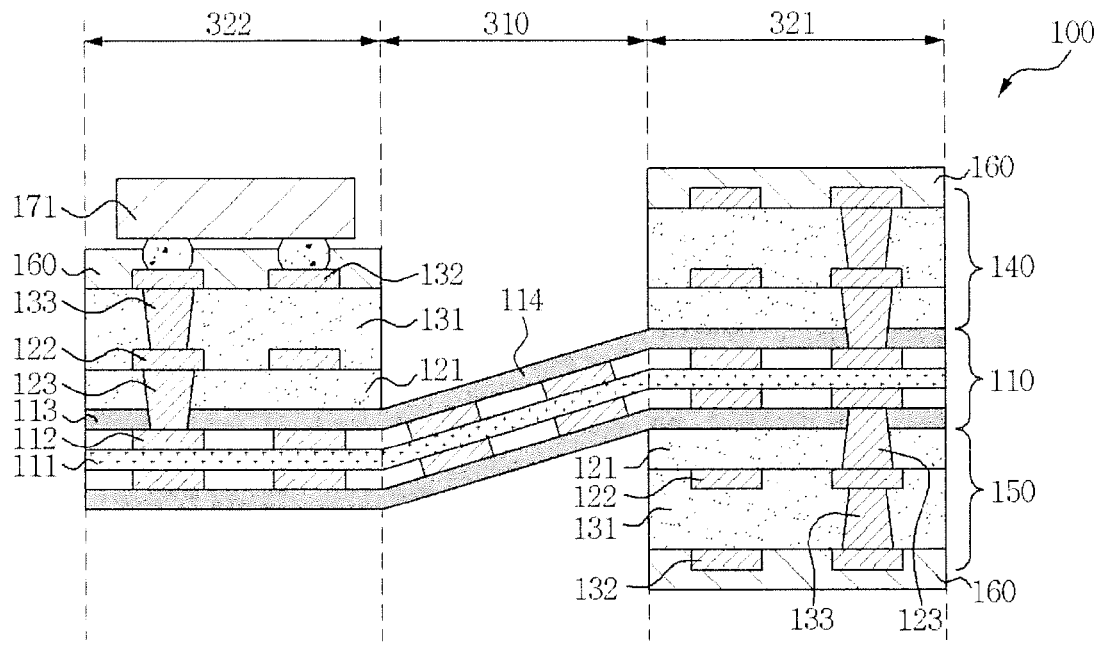
FIG. 1 is an illustration view showing a rigid flexible printed circuit board according to an exemplary embodiment of the present disclosure.

The objects, features and advantages of the present disclosure will be more clearly understood from the following detailed description of the exemplary embodiments taken in conjunction with the accompanying drawings. Throughout the accompanying drawings, the same reference numerals are used to designate the same or similar components, and redundant descriptions thereof are omitted. Further, in the following description, the terms "first," "second," "one side," "the other side" and the like are used to differentiate a certain component from other components, but the configuration of such components should not be construed to be limited by the terms. Further, in the description of the present disclosure, when it is determined that the detailed description of the related art would obscure the gist of the present disclosure, the description thereof will be omitted.

Hereinafter, exemplary embodiments of the present disclosure will be described in detail with reference to the accompanying drawings.

FIG. 1 is an illustration view showing a rigid flexible printed circuit board 100 according to an exemplary embodiment of the present disclosure.

Referring to FIG. 1, the rigid flexible printed circuit board 100 may include a flexible board 110, a first rigid board 140, a second rigid board 150, an outer layer protective layer 160, and a first component 171.

According to an exemplary embodiment of the present disclosure, the flexible board 110 may include a flexible insulating layer 111, an internal circuit pattern 112, and an internal protective layer 113.

According to an exemplary embodiment of the present disclosure, the flexible insulating layer 111 may be formed of a flexible insulating film. For example, the flexible insulating layer 111 may be formed of polyimide (PI).

According to an exemplary embodiment of the present disclosure, an internal circuit pattern 112 may be formed on the flexible insulating layer 111. As shown in FIG. 1, the internal circuit patterns 112 are formed on both surfaces of the flexible insulating layer 111. However, the internal circuit patterns 112 are not limited to being formed on both surfaces of the flexible insulating layer 111. For example, the internal circuit pattern 112 may be formed only on one surface of the flexible insulating layer 111.

According to an exemplary embodiment of the present disclosure, an internal circuit pattern 112 may be formed of a conductive material which is used in a field of circuit board. For example, the internal circuit pattern 112 may be formed of copper.

According to an exemplary embodiment of the present disclosure, the internal protective layer 113 may be formed on the flexible insulating layer 111 and the internal circuit pattern 112. The internal protective layer 113 as described above may be formed to protect the internal circuit patterns 112 from an external environment. For example, the internal protective layer 113 may be formed of a coverlay.

In addition, according to an exemplary embodiment of the present disclosure, the internal adhesive layer 114 may be further formed to improve adhesion between the internal circuit pattern 112 and the internal protective layer 113. The internal adhesive layer 114 as described above may be formed between the internal circuit pattern 112 and the flexible insulating layer 111, and the internal protective layer 113.

The flexible board 110 formed as described above may be divided into a flexible region 310, a first rigid region 321, and a second rigid region 322. The first rigid region 321 may be positioned at one side of the flexible board 110 and the second rigid region 322 may be positioned at the other side thereof.

Although an exemplary embodiment of the present disclosure describes a case in which the flexible board 110 includes one flexible region and two rigid regions, this is merely an exemplary embodiment and the number of flexible regions and rigid regions may be changed by selection of those skilled in the art.

In addition, although an exemplary embodiment of the present disclosure describes a case in which the flexible board 110 includes one flexible insulating layer and one internal circuit pattern, the present disclosure is not limited thereto. That is, the flexible board 110 may include a multilayer flexible insulating layer and a multilayer internal circuit pattern as well as one flexible insulating layer and one internal circuit pattern, depending on selection of those skilled in the art.

According to an exemplary embodiment of the present disclosure, the first rigid board 140 may be formed on the flexible board 110. In addition, the first rigid board 140 may be formed in the first rigid region 321 and the second rigid region 322. The first rigid board 140 as described above may include a first insulating layer 121, a second insulating layer 131, a first circuit pattern 122, and a second circuit pattern 132. In addition, the first rigid board 140 may further include a first via 123 and a second via 133. The first via 123 may penetrate through the first insulating layer 121 to electrically connect the internal circuit pattern 112 and the first circuit pattern 122 to each other. The second via 133 may penetrate through the second insulating layer 131 to electrically connect the first circuit pattern 122 and the second circuit pattern 132 to each other.

The first insulating layer 121 and the second insulating layer 131 according to an exemplary embodiment of the present disclosure may be formed of an insulating material used in the field of board such as an epoxy resin or a prepreg. In addition, the first insulating layer 121 and the second insulating layer 131 may be a flexible insulating film.

In addition, the first circuit pattern 122 and the second circuit pattern 132 may be formed of a conductive material used in the field of circuit board such as copper.

According to an exemplary embodiment of the present disclosure, the second rigid board 150 may be formed below the flexible board 110. In addition, the second rigid board 150 may be formed in the first rigid region 321. The second rigid board 150 as described above may include the first insulating layer 121, the second insulating layer 131, the first circuit pattern 122, and the second circuit pattern 132. In addition, the second rigid board 150 may further include a first via 123 and a second via 133.

According to an exemplary embodiment of the present disclosure, the first rigid board 140 and the second rigid board 150 may be classified depending on a location based on the flexible board 110. That is, the insulating layer and the circuit pattern formed on the flexible board 110 may be classified as the first rigid board 140, and the insulating layer and the circuit pattern formed below the flexible board 110 may be classified as the second rigid board 150. In addition, although it is illustrated that the first rigid board 140 and the second rigid board 150 include both the first circuit pattern 122 and the second circuit pattern 132, the present disclosure is not limited thereto. That is, the circuit patterns included in the first rigid board 140 and the second rigid board 150 may have different structures and formation positions according to a method of forming the rigid flexible printed circuit board 100.

According to an exemplary embodiment of the present disclosure, the outer layer protective layers 160 may be formed on the outermost layers of the first rigid board 140 and the second rigid board 150. The outer layer protective layer 160 may be formed to protect the first rigid board 140 and the second rigid board 150 from an external environment or a material such as a solder, or the like. For example, the outer layer protective layer 160 may be formed of a liquid or film type of solder resist. Alternatively, the outer layer protective layer 160 may be formed of a coverlay. However, the material of the outer layer protective layer 160 is not limited thereto, but may be selected from a plurality of materials capable of protecting a circuit pattern in a field of circuit board.

According to an exemplary embodiment of the present disclosure, the first component 171 may be mounted on the first rigid board 140 of the second rigid region 322. For example, the first component 171 may be any one of known components which are mounted on the rigid flexible printed circuit board.

According to an exemplary embodiment of the present disclosure, only the first rigid board 140 may be formed in the second rigid region 322 on which the first component 171 is mounted, and the first rigid region 321 and the second rigid region 322 may have thicknesses different from each other. The flexible region 310 may be bent so that an upper surface of the first component 171 is positioned at the same height as or a height lower than an upper surface of the first rigid board 140 or the outer layer protective layer 160 in the first rigid region 321.

Even in the case in which the components are mounted by the structure as described above, a thickness increase of the rigid flexible printed circuit board 100 may be minimized.

FIGS. 2 to 10 are illustration views showing a method of manufacturing a rigid flexible printed circuit board according to an exemplary embodiment of the present disclosure.

Figure 2:
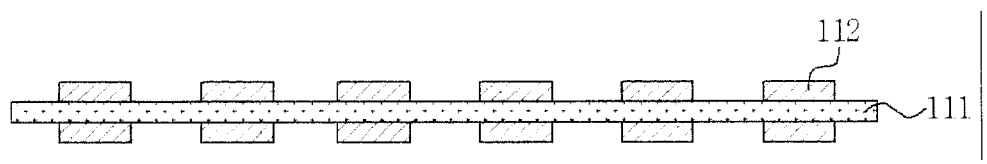
FIGS. 2 to 10 are illustration views showing a method of manufacturing a rigid flexible printed circuit board according to an exemplary embodiment of the present disclosure.

Referring to FIG. 2, the flexible insulating layer 111 and the internal circuit patterns 112 may be formed.

According to an exemplary embodiment of the present disclosure, the flexible insulating layer 111 may be formed of a flexible insulating film. For example, the flexible insulating layer 111 may be formed of polyimide (PI).

According to an exemplary embodiment of the present disclosure, the internal circuit pattern 112 may be formed on the flexible insulating layer 111. As shown in FIG. 2, the internal circuit patterns 112 are formed on both surfaces of the flexible insulating layer 111. However, the internal circuit patterns 112 are not limited to being formed on both surfaces of the flexible insulating layer 111. For example, the internal circuit pattern 112 may be formed only on one surface of the flexible insulating layer 111. In addition, the internal circuit pattern 112 may be formed of a conductive material which is used in a field of circuit board. For example, the internal circuit pattern 112 may be formed of copper.

The flexible insulating layer 111 and the internal circuit pattern 112 according to an exemplary embodiment of the present disclosure may be formed by using a double-sided flexible copper clad laminate (FCCL). The double-sided FCCL has a structure in which copper foils are formed on both surfaces of a flexible insulating film. For example, the copper foils of the double-sided FCCL may be patterned to form the internal circuit patterns 112. However, this is merely an example, and the present disclosure is not limited thereto.

Figure 3:
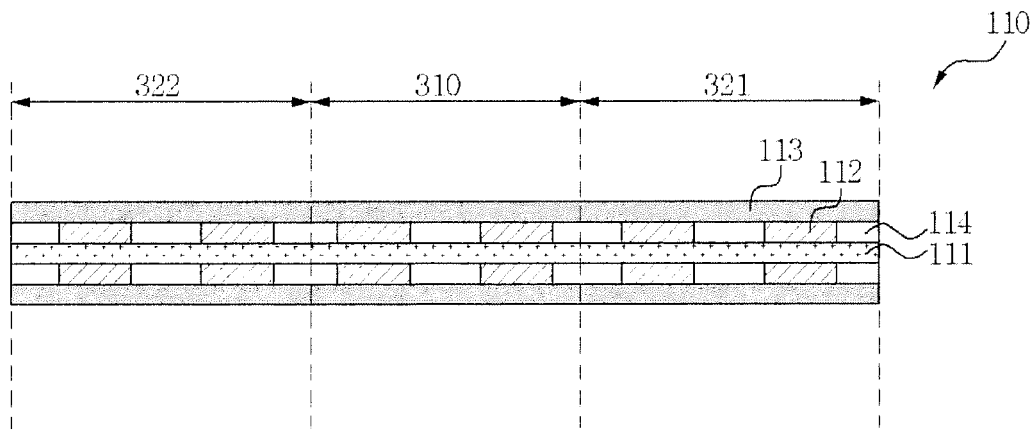

Referring to FIG. 3, the internal protective layer 113 may be formed.

According to an exemplary embodiment of the present disclosure, the internal protective layer 113 may be formed on the flexible insulating layer 111 and the internal circuit pattern 112. The internal protective layer 113 as described above may be formed to protect the internal circuit patterns 112 from an external environment. For example, the internal protective layer 113 may be formed of a coverlay.

In addition, the internal adhesive layer 114 may be further formed to improve adhesion between the internal circuit pattern 112 and the internal protective layer 113. The internal adhesive layer 114 as described above may be formed between the internal circuit pattern 112 and the flexible insulating layer 111, and the internal protective layer 113.

The flexible board 110 formed as described above may be divided into a flexible region 310, a first rigid region 321, and a second rigid region 322. The first rigid region 321 may be positioned at one side of the flexible board 110 and second rigid region 322 may be positioned at the other side thereof.

Although an exemplary embodiment of the present disclosure describes a case in which the flexible board 110 includes one flexible region and two rigid regions, this is merely an exemplary embodiment and the number of flexible regions and rigid regions may be changed by selection of those skilled in the art.

In addition, although an exemplary embodiment of the present disclosure describes a case in which the flexible board 110 includes one flexible insulating layer and one internal circuit pattern, the present disclosure is not limited thereto. That is, the flexible board 110 may include a multilayer flexible insulating layer and a multilayer internal circuit pattern as well as one flexible insulating layer and one internal circuit pattern, depending on selection of those skilled in the art.

Figure 4:
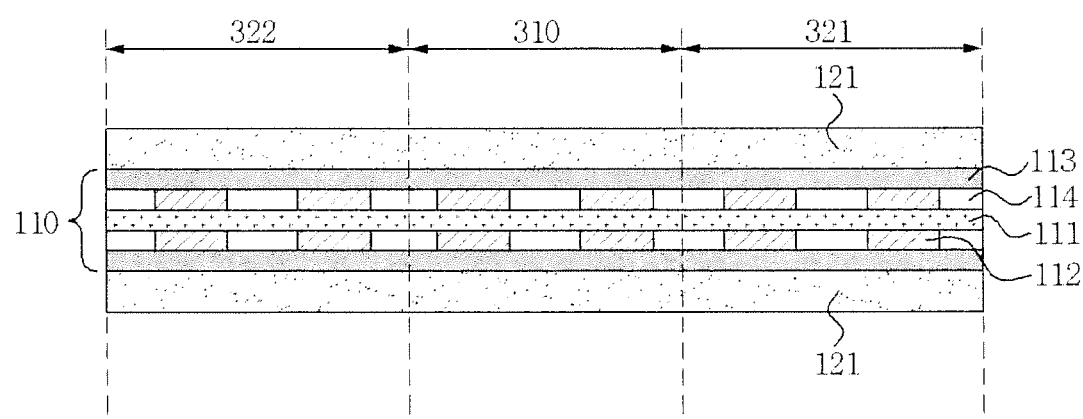

Referring to FIG. 4, the first insulating layer 121 may be formed on the flexible board 110.

According to an exemplary embodiment of the present disclosure, the first insulating layers 121 may be formed on upper and lower portions of the flexible board 110.

According to an exemplary embodiment of the present disclosure, the first insulating layer 121 may be formed of an insulating material used in the field of board such as an epoxy resin or a prepreg. In addition, the first insulating layer 121 and a metal layer (not shown) may be formed by attaching a single-sided FCCL onto the flexible board 110. Here, the single-sided FCCL has a structure in which a copper foil is formed on one surface of a flexible insulating film.

Figure 5:
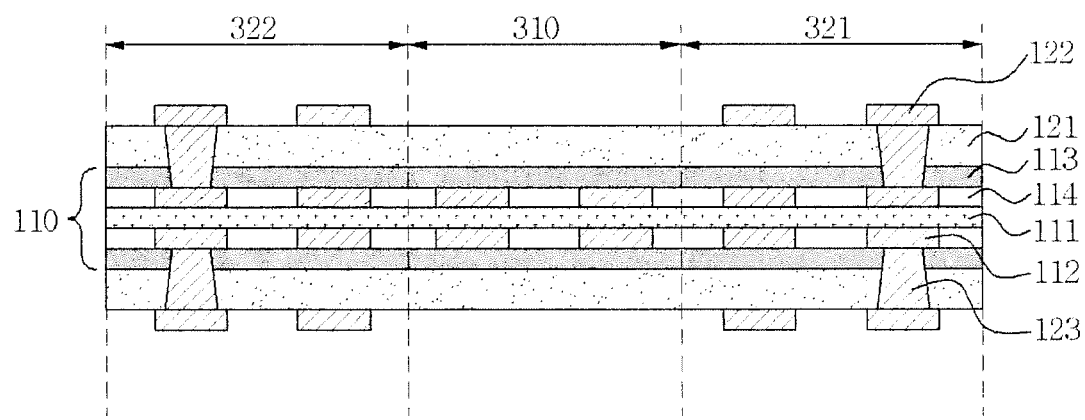

Referring to FIG. 5, the first circuit pattern 122 and the first via 123 may be formed.

According to an exemplary embodiment of the present disclosure, the first circuit pattern 122 may be formed on the first insulating layer 121. In addition, the first via 123 may penetrate through the first insulating layer 121 and the internal protective layer 113 to electrically connect the internal circuit pattern 112 and the first circuit pattern 122 to each other.

For example, a via hole (not shown) is formed in the first insulating layer 121 and the conductive material is printed or plated on the via hole and the first insulating layer 121, such that the first via 123 may be formed. Next, the first circuit pattern 122 may be formed by patterning the conductive maternal formed on the first insulating layer 121.

If the first insulating layer 121 is formed by using the single-sided FCCL, the first circuit pattern 122 may be formed by forming the first via 123 and then patterning the metal layer (not shown).

A method of forming the first circuit pattern 122 and the first via 123 as described above is not limited to the above-mentioned method. The first circuit pattern 122 and the first via 123 may be formed by any method of methods which are known in the field of circuit board. In addition, the first circuit pattern 122 and the first via 123 may be formed on both the upper and lower portions of the flexible board 110.

According to an exemplary embodiment of the present disclosure, the first circuit pattern 122 and the first via 123 may be formed in the first rigid region 321 and the second rigid region 322.

Figure 6:
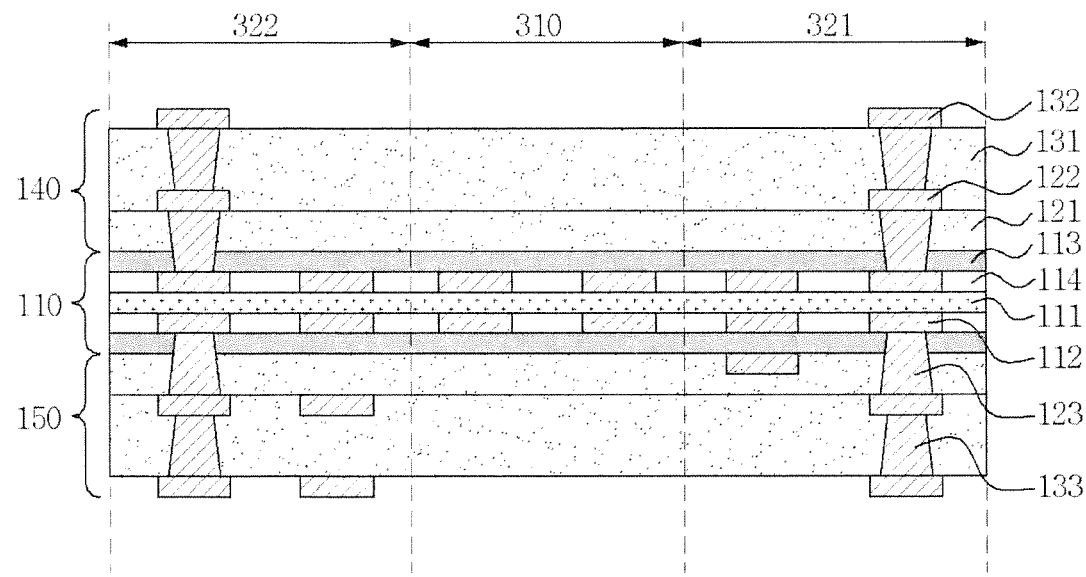

Referring to FIG. 6, the second insulating layer 131, the second circuit pattern 132, and the second via 133 may be formed.

According to an exemplary embodiment of the present disclosure, the second insulating layer 131 may be formed on the first insulating layer 121 to bury the first circuit pattern 122. In addition, the second circuit pattern 132 may be formed on the second insulating layer 131. In addition, the second via 133 may be formed in the second insulating layer 131 to electrically connect the first circuit pattern 122 and the second circuit pattern 132 to each other.

A method of forming the second insulating layer 131, the second circuit pattern 132, and the second via 133 according to an exemplary embodiment of the present disclosure may be any method of forming an insulating layer, a circuit pattern, and a via which is known in the field of circuit board.

According to an exemplary embodiment of the present disclosure, the second circuit pattern 132 and the second via 133 may be formed in the first rigid region 321 and the second rigid region 322.

According to an exemplary embodiment of the present disclosure, the first rigid board 140 may be formed on the flexible board 110 and the second rigid board 150 may be formed below the flexible board 110. That is, the first rigid board 140 may include the first insulating layer 121, the second insulating layer 131, the first circuit pattern 122, the second circuit pattern 132, the first via 123, and the second via 133 which are formed on the flexible board 110. In addition, the second rigid board 150 may include the first insulating layer 121, the second insulating layer 131, the first circuit pattern 122, the second circuit pattern 132, the first via 123, and the second via 133 which are formed below the flexible board 110.

Figure 7:
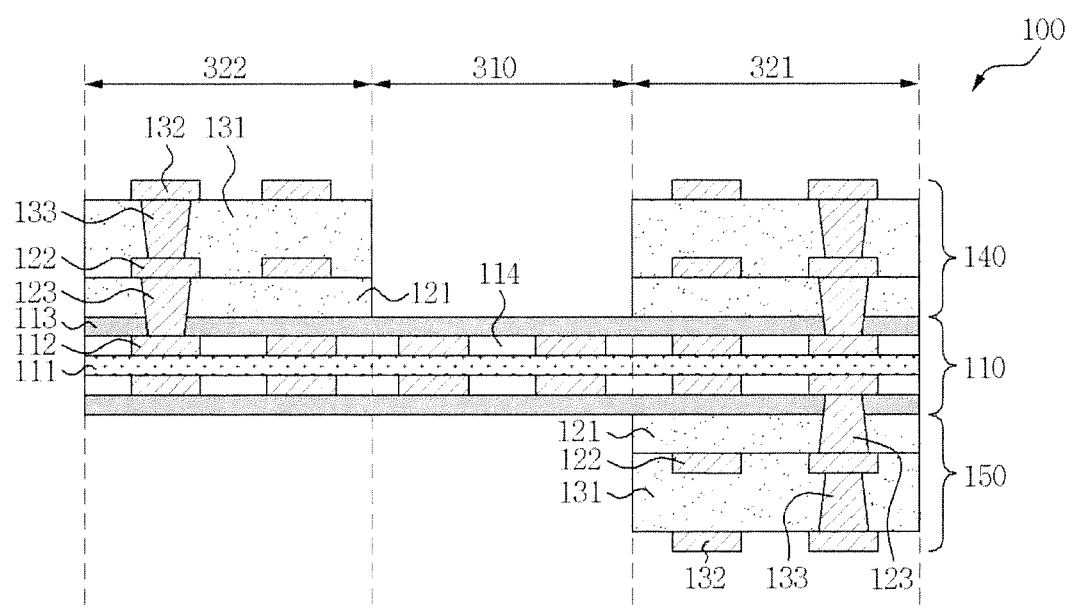

Referring to FIG. 7, the first rigid board 140 in the flexible region 310 and the second rigid board 150 in the second rigid region 322 and the flexible region 310 may be removed.

According to an exemplary embodiment of the present disclosure, the first rigid board 140 in the flexible region 310 and the second rigid board 150 in the second rigid region 322 and the flexible region 310 may be removed by a laser machining method. However, the method of removing the first rigid board 140 in the flexible region 310 and the second rigid board 150 in the second rigid region 322 and the flexible region 310 is not limited to the laser machining method. For example, various removing methods used in the field of circuit board may be used.

According to an exemplary embodiment of the present disclosure, the first rigid board 140 in the flexible region 310 and the second rigid board 150 in the flexible region 310 and the second rigid region 322 may be simultaneously removed. However, the first rigid board 140 in the flexible region 310 and the second board 150 in the second rigid region 322 and the flexible region 310 may also be removed simultaneously or separately depending on selection of those skilled in the art.

If the first rigid board 140 in the flexible region 310 and the second rigid board 150 in the flexible region 310 and the second rigid region 322 are simultaneously removed, a separate additional process is not required.

By the processes as described above, the rigid flexible printed circuit board 100 including various thicknesses may be formed.

Figure 8:
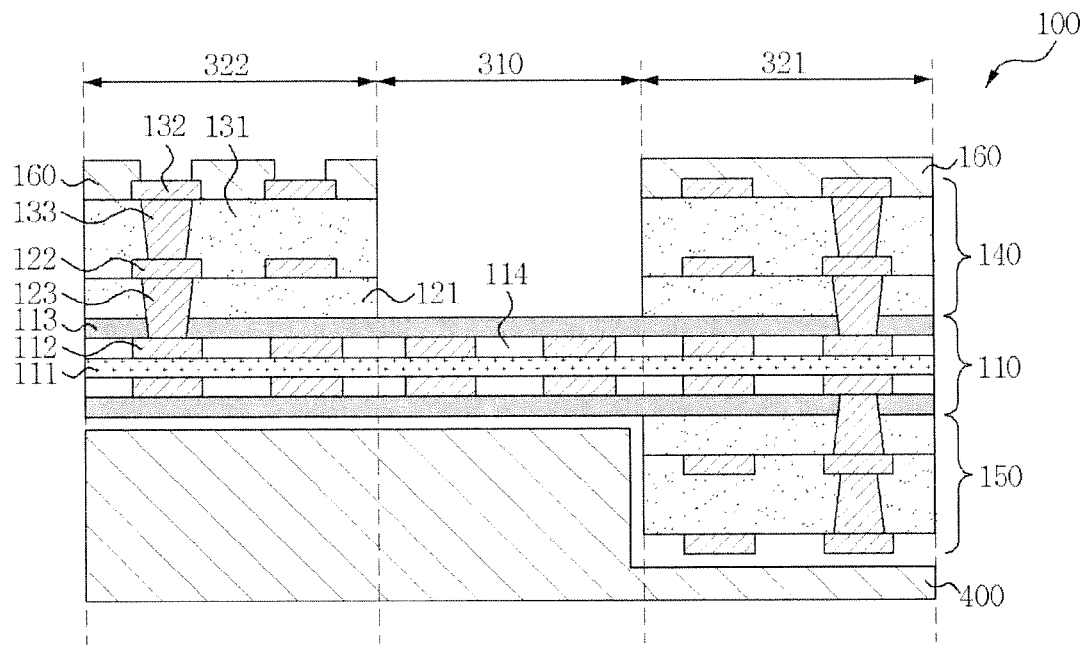
Figure 9:
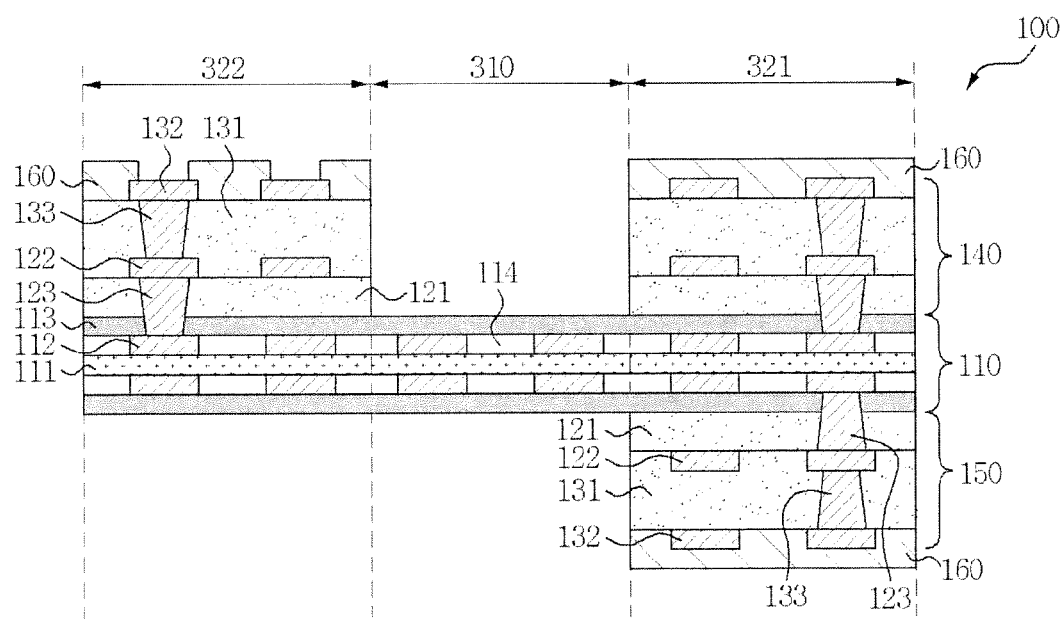

Referring to FIGS. 8 and 9, the outer layer protective layer 160 may be formed.

According to an exemplary embodiment of the present disclosure, first, the rigid flexible printed circuit board 100 may be supported by using a supporting part 400.

The supporting part 400, which is a structure having steps, may support the lower portion of the flexible board 110. That is, a protruded portion of the supporting part 400 may support the lower portion of the flexible board 110 of the flexible region 310 and the second rigid region 322.

A step between positions of upper surfaces of the first rigid board 140 in the second rigid region 322 and first rigid region 321 may be minimized by the supporting part 400.

Next, the outer layer protective layer 160 may be formed on the first rigid board 140 of the first rigid region 321 and the second rigid region 322. The outer layer protective layer 160 may be formed to protect the first rigid board 140 from an external environment or a material such as a solder, or the like. For example, the outer layer protective layer 160 may be formed of a liquid or film type of solder resist. Alternatively, the outer layer protective layer 160 may be formed of a coverlay. However, the material of the outer layer protective layer 160 is not limited thereto, but may be selected from a plurality of materials capable of protecting a circuit pattern in a field of circuit board. In addition, a method of forming the outer layer protective layer 160 may be changed depending on the selected material.

In addition, after the upper portion of the rigid flexible printed circuit board 100 is supported by the supporting part 400, the outer layer protective layer 160 may be formed on the second rigid board 150. For example, after the upper and lower portions of the rigid flexible printed circuit board 100 are reversed to allow the first rigid board 140 to be directed downward, the flexible board 110 exposed between the first rigid boards 140 may be supported by the supporting part 400.

According to an exemplary embodiment of the present disclosure, the step between the first rigid board 140 and the second rigid board 150 is minimized by the supporting part 400, such that defect that the outer layer protective layer 160 is aggregated or not formed in a predetermined portion, or the like may be decreased.

Although the supporting part 400 is used to form the outer layer protective layer 160 in an exemplary embodiment of the present disclosure, the present disclosure is not limited thereto. Whether or not the supporting part 400 is used and a kind of supporting part 400 may be changed depending on the selection of those skilled in the art.

Figure 10:
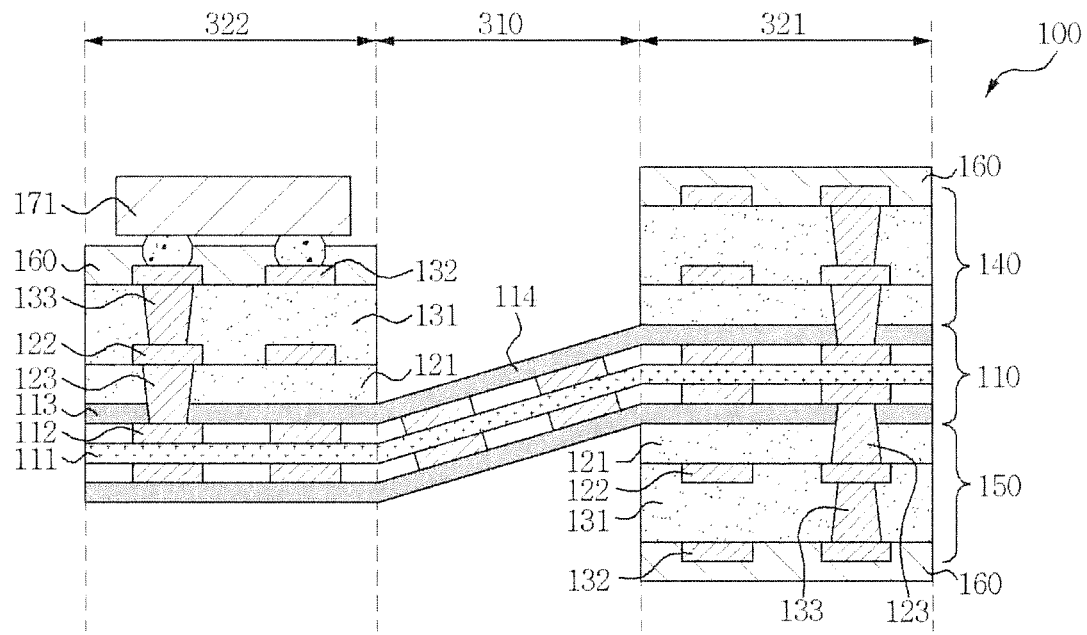

Referring to FIG. 10, the first component 171 may be mounted.

According to an exemplary embodiment of the present disclosure, the first component 171 may be mounted on the first rigid board 140 of the second rigid region 322. For example, the first component 171 may be any one of known components which are mounted on the rigid flexible printed circuit board.

According to an exemplary embodiment of the present disclosure, after the first component 171 is mounted, the flexible region 310 may be bent. That is, the flexible board 110 may be bent so that an upper surface of the first component 171 is positioned at the same height as or a height lower than an upper surface of the first rigid board 140 of the first rigid region 321. If the outer layer protective layer 160 is formed on the rigid flexible printed circuit board 100, the flexible board 110 may be bent so that the upper surface of the first component 171 is positioned at the same height as or a height lower than an upper surface of the outer layer protective layer 160 of first rigid region 321.

Figure 11:
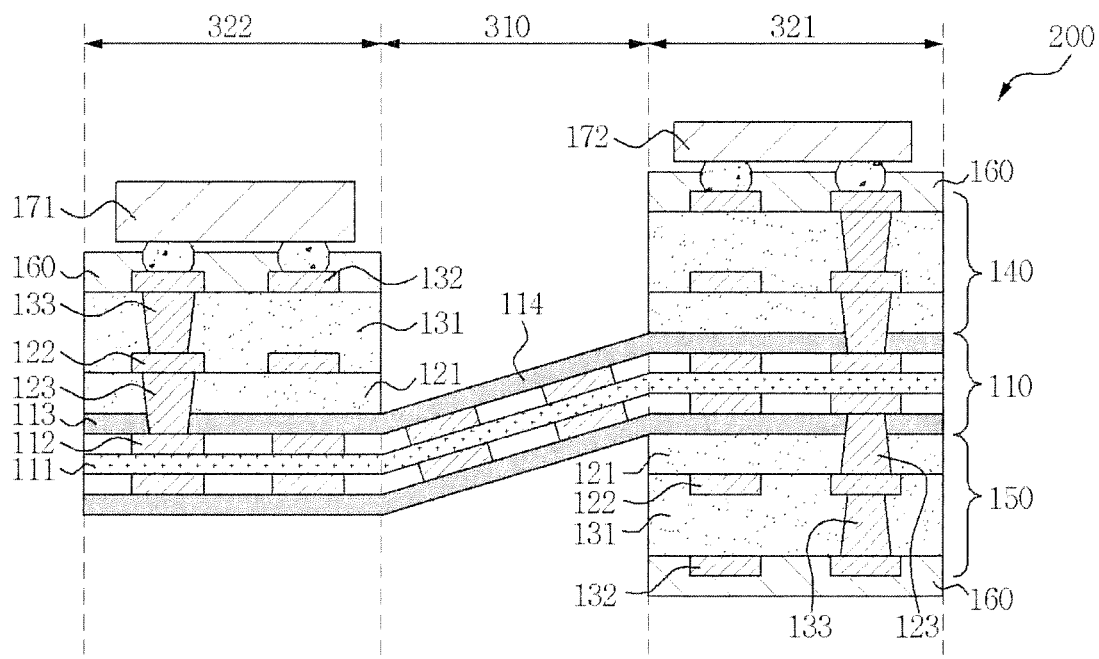
FIG. 11 is an illustration view showing a rigid flexible printed circuit board according to another exemplary embodiment of the present disclosure.

FIG. 11 is an illustration view showing a rigid flexible printed circuit board according to another exemplary embodiment of the present disclosure.

Referring to FIG. 11, both the first component 171 and the second component 172 may be formed on a rigid flexible board 200. That is, the first component 171 may be mounted on the second rigid region 322 of the first rigid board and the second component 172 may be mounted on the first rigid region 321. For example, the first component 171 and the second component 172 may be any one of known components which are mounted on the rigid flexible printed circuit board. In addition, the first component 171 and the second component 172 may have thicknesses different from each other.

According to an exemplary embodiment of the present disclosure, after the first component 171 and the second component 172 are mounted, the flexible region 310 may be bent. That is, the flexible board 110 may be bent so that an upper surface of the first component 171 is positioned at the same height as or a height lower than an upper surface of the second component 172.

The rigid flexible printed circuit board according to an exemplary embodiment of the present disclosure may minimize the thickness increase by removing unnecessary portions of the regions on which the components are mounted and bending the flexible board.

Although the embodiments of the present disclosure have been disclosed for illustrative purposes, it will be appreciated that the present disclosure is not limited thereto, and those skilled in the art will appreciate that various modifications, additions and substitutions are possible, without departing from the scope and spirit of the disclosure.

Accordingly, any and all modifications, variations or equivalent arrangements should be considered to be within the scope of the disclosure, and the detailed scope of the disclosure will be disclosed by the accompanying claims.

What is claimed is:

1. A rigid flexible printed circuit board comprising:
   a flexible board including a flexible region, a first rigid region formed at one side of the flexible region, and a second rigid region formed at the other side of the flexible region;
   a first rigid board formed on the flexible board and formed in the first rigid region and the second rigid region; and
   a second rigid board formed below the flexible board and formed in the first rigid region
   wherein the first rigid region is formed to be thicker than the second rigid region,
   wherein the first rigid region has a pad formed and exposed on at least one of an upper surface and a lower surface thereof for mounting a second component, and
   wherein the second rigid region has a pad formed and exposed on at least one of an upper surface and a lower surface thereof for mounting a first component, the first component being thicker than the second component.

2. The rigid flexible printed circuit board of claim 1, wherein the flexible board includes an insulating layer and a circuit pattern.

3. The rigid flexible printed circuit board of claim 1, wherein the first rigid board and the second rigid board include an insulating layer and a circuit pattern.

4. The rigid flexible printed circuit board of claim 1, wherein the flexible board in the flexible region is bent so that an upper surface of the first component is positioned at the same height as or a height lower than an upper surface of the first rigid board formed in the first rigid region.

5. The rigid flexible printed circuit board of claim 1, wherein the flexible board is bent so that an upper surface of the first component is positioned at the same height as or a height lower than an upper surface of the second component.

6. The rigid flexible printed circuit board of claim 1, further comprising a protective layer formed on the outermost layer of at least one of the first rigid board and the second rigid board.

7. The rigid flexible printed circuit board of claim 6, wherein the protective layer is a solder resist.

8. A method of manufacturing a rigid flexible printed circuit board, the method comprising:
   forming a flexible board including a flexible region, a first rigid region formed at one side of the flexible region, and a second rigid region formed at the other side of the flexible region;
   forming a first rigid board on the flexible board and forming a second rigid board below the flexible board; and
   removing the first rigid board and the second rigid board from the flexible region so as to allow the flexible board to be exposed, and removing the second rigid board from the second rigid region so as to allow the first rigid region to be thicker than the second rigid region,
   wherein the first rigid region has a pad formed and exposed on at least one of an upper surface and a lower surface thereof for mounting a second component, and
   wherein the second rigid region has a pad formed and exposed on at least one of an upper surface and a lower surface thereof for mounting a first component, the first component being thicker than the second component.

9. The method of claim 8, wherein in the forming of the flexible board, the flexible board is formed to include an insulating layer and a circuit pattern.

10. The method of claim 8, wherein in the forming of the first rigid board and the second rigid board, the first rigid board and the second rigid board are formed to include an insulating layer and a circuit pattern.

11. The method of claim 8, wherein in the removing of the first rigid board in the flexible region and the second rigid board in the second rigid region and the flexible region, the first rigid board and the second rigid board are simultaneously removed.

12. The method of claim 8, wherein in the removing of the first rigid board in the flexible region and the second rigid boards in the second rigid region and the flexible region, the removal is performed by a laser machining method.

13. The method of claim 8, further comprising, after the removing of the first rigid board in the flexible region and the second rigid boards in the second rigid region and the flexible region, bending the flexible board in the flexible region so that an upper surface of the first component is positioned at the same height as or a height lower than an upper surface of the first rigid board formed in the first rigid region.

14. The method of claim 8, further comprising, after the removing of the first rigid board in the flexible region and the second rigid boards in the second rigid region and the flexible region, bending the flexible board in the flexible region so that an upper surface of the first component is positioned at the same height as or a height lower than an upper surface of the second component.

15. The method of claim 8, further comprising, after the removing of the first rigid board in the flexible region and the second rigid boards in the second rigid region and the flexible region, forming an outer layer protective layer on the outermost layer of at least one of the first rigid board and the second rigid board.

16. The method of claim 15, wherein in the forming of the outer layer protective layer, the outer layer protective layer is formed of a solder resist.

17. The method of claim 15, further comprising, before the forming of the outer layer protective layer, supporting the flexible boards in the flexible region and the second rigid region by using a supporting part.

* * * * *